(12) United States Patent
Pai et al.

(10) Patent No.: US 6,338,249 B1
(45) Date of Patent: Jan. 15, 2002

(54) ELECTROTHERMALLY ACTUATED VIBROMOTOR

(75) Inventors: Minfan Pai; Norman C. Tien, both of Ithaca, NY (US)

(73) Assignee: Corning, Incorporated, Corning, NY (US)

( * ) Notice: Subject to any disclaimer, the term of this patent is extended or adjusted under 35 U.S.C. 154(b) by 0 days.

(21) Appl. No.: 09/549,381

(22) Filed: Apr. 13, 2000

Related U.S. Application Data
(60) Provisional application No. 60/129,486, filed on Apr. 15, 1999.

(51) Int. Cl.[7] .............................................. F01B 29/10
(52) U.S. Cl. ........................................ 60/528; 60/527
(58) Field of Search ........................ 60/527, 528, 529, 60/530

(56) References Cited

U.S. PATENT DOCUMENTS

| | | | | |
|---|---|---|---|---|
| 4,553,394 A | | 11/1985 | Weinert | 60/530 |
| 5,335,498 A | * | 8/1994 | Komatsu et al. | 60/527 X |
| 5,396,769 A | | 3/1995 | Brudnicki | 60/528 |
| 5,426,070 A | | 6/1995 | Shaw et al. | 437/203 |
| 5,628,917 A | | 5/1997 | MacDonald et al. | 216/2 |
| 5,719,073 A | | 2/1998 | Shaw et al. | 437/228 |
| 5,726,073 A | | 3/1998 | Zhang et al. | 437/228 |
| 5,846,849 A | | 12/1998 | Shaw et al. | 438/52 |
| 5,996,346 A | * | 12/1999 | Maynard | 60/527 |

OTHER PUBLICATIONS

E.W. Becker, W. Ehrfeld, P. Hagmann, A. Maner and D. Muchmeyer–Fabrication of microstructures with high aspect ratios and great structural heights by synchroton radiation lithography, gavanoforming, and plastic moulding (LIGA process)—Mar. 3, 1986.

Jurgen Mohr, Jost Gottert, Andre Muller, Patrick Ruther, Klaus Wengeling, Forschungszentrum Karlsruhe and Institute fUr Mikrostructurtechnik–Micro–Optical and Opto–Mechanical Systems Fabricated by the LIGA Technique.

Soek–Whan Chung and Yong–Kewon Kim–Measurements of a Fabricated Micro Mirror Using a Lateral–Effect Position–Sensitive Photodiode—Dec. 1998.

Meng–Hsiung Kiang, Olav Solgaard, Kam Y. Lau, and Richard S. Muller–Electrostatic Combdrive–Actuated Micromirrors for Laser–Beam Scanning and Positioning—Mar., 1998.

Cornel Marxer, Christian Thio, Marc–Alexia Gretillat, Nicolaas F. de Rooij, Rainer Battig, Oliver Anthamatten, Bernd Valk and Paul Vogel–Vertical Mirrors Fabricated by Deep Reactive Ion Etching for Fiber–Optic Switching Application–Sep., 1997.

Yuji Uenishi, Masahiro Tsugai and Mehran Mehregany— Micro–opto–mechanical devices fabricated by anisotropic etching of (110) silicon.

* cited by examiner

Primary Examiner—Hoang Nguyen
(74) Attorney, Agent, or Firm—Juliana Agon

(57) ABSTRACT

A vibromotor (10) includes a polysilicon surface-micromachined substrate. A movable guided element is slidably mounted on the substrate. At least one thermal actuator (20) has an impact head (40) and an anchoring end. The anchoring end pivotally disposed on the substrate external to a side of the movable guided element controls the movement of the movable guided element by electrothermally biasing the impact head (40) to tap against the movable guided element.

20 Claims, 9 Drawing Sheets

ELECTROTHERMALLY ACTUATED VIBROMOTOR

CROSS-REFERENCE TO RELATED APPLICATIONS

This application is based upon U.S. Provisional Application Ser. No. 60/129,486 filed on Apr. 15, 1999, from which the benefit of priority pursuant to 35 USC § 120 is hereby claimed, and the full content which is incorporated herein by references as though fully set forth.

BACKGROUND OF THE INVENTION

1. Field of the Invention

The present invention relates generally to microactuators, and particularly to switching of micromirrors in microelectromechanical systems (MEMS).

2. Technical Background

Micromechanical actuators are essential for microelectromechanical systems (MEMS) that require movable components. For applications such as a free-space optical fiber switch or for self-assembly of a three-dimensional MEMS structure, a compact actuator with long-range fast-speed traveling ability is often necessary. Known actuators have mechanical power transmission mechanisms based on an electrostatic driving element, such as scratch drive actuators, resonator-based vibromotors, microengines and stepper motors. Most of the devices, however, require not only large areas (>1 mm$_2$) but also large driving voltages (10's of volts to more than 100 volts). Moreover, either two sets of actuators or complicated phase-matching operation is required for the actuators to have a two-direction actuation capability. As multiple devices are needed on a chip, the actuators desired need to occupy a sufficiently small space and be driven using low voltages. It is further desired to be able to change the direction of the actuator by simply adjusting the applied electrical current, in order to save space and simplify the power supply design of the MEMS

DETAILED DESCRIPTION OF THE PREFERRED EMBODIMENTS

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

A polysilicon surface-micromachined electrothermal vibromotor (ETV motor) that is capable of long travel ranges, high speeds and simple directional control is taught by the present invention. With features like integrated circuit compatible driving voltages, and very small footprint, it is especially suitable for systems requiring a high-density of actuated devices on a silicon chip. The electrothermal-based vibromotor, taught by the present invention, occupies a space smaller than 200×300$\mu m^2$ and is driven using CMOS integrated circuit compatible voltages. Furthermore, the direction of the vibromotor can be changed by simply adjusting the applied electrical current, greatly simplifying the power supply design of the fiber optic switch system. Optimization of the power consumption and speed of the linear vibromotor can be made using different materials and through better thermomechanical design of the thermal actuator.

Figure 9:
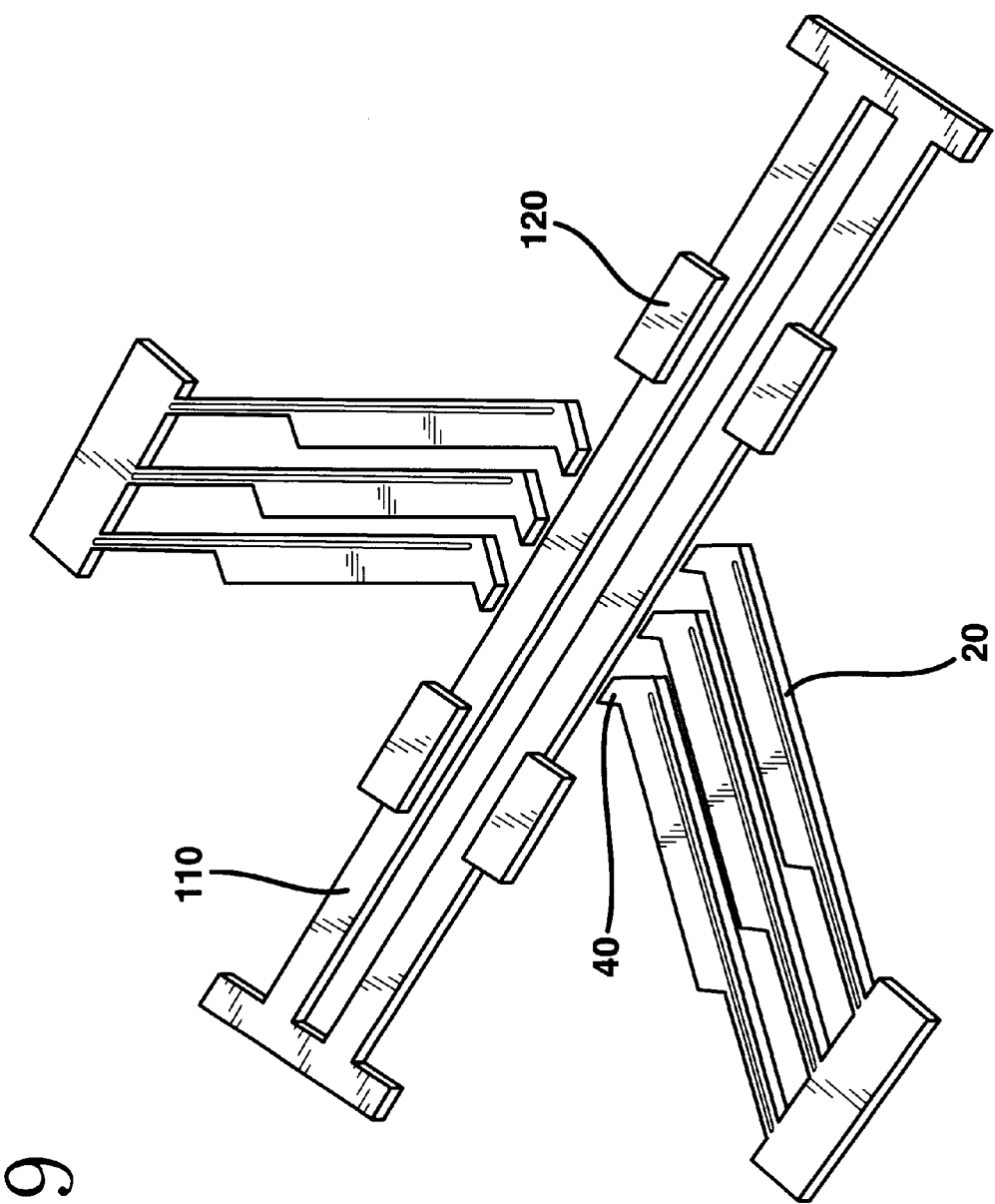
FIG. 9 is a perspective view representation of the electrothermal vibromotor 10 of FIG. 1, in accordance with the present invention.

It is known that vibromotors rely on impact actuation to obtain relatively large armature movement from small-displacement vibrating elements. The present invention teaches a different method and apparatus to provide the impact actuation. A representation of an electrothermal linear vibromotor including vibrating thermal elements that drive a guided slider or any other movable guided element through oblique impact is shown in FIG. 1 and FIG. 9.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of an apparatus of the present invention is the vibromotor of the present invention as shown in FIG. 1 and FIG. 9, and is designated generally throughout by reference numeral 10.

Figure 1:
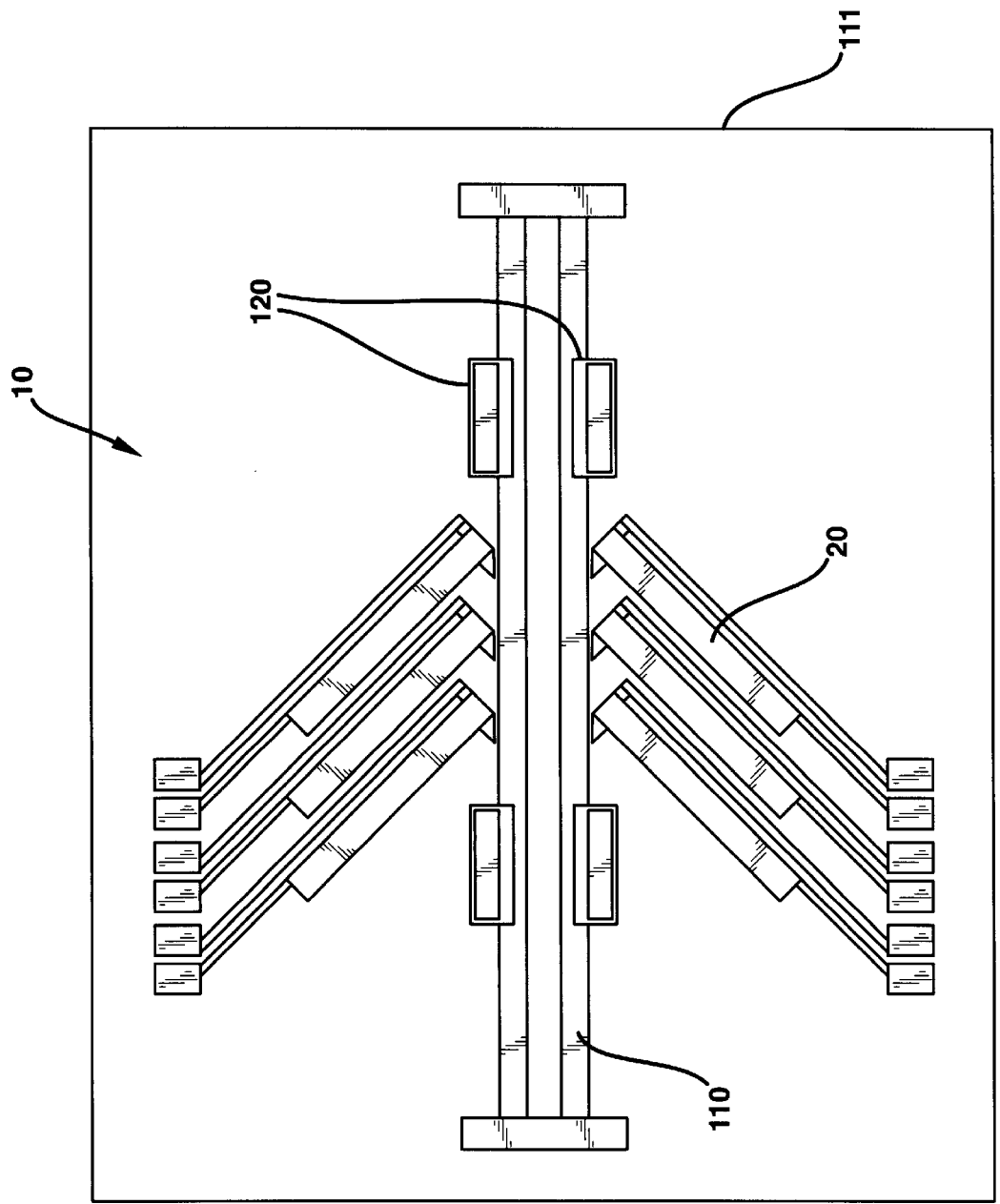
FIG. 1 is a top view representation of an electrothermal vibromotor, in accordance with the present invention.

Referring to FIG. 1, an apparatus 10 to provide impact actuation in a microelectromechanical system (MEMS) includes an electrothermal linear vibromotor having at least one vibrating thermal element 20 pivotally attached for providing oblique impact actuation. A movable guided element 10 is slidable in response to the oblique impact actuation of the electrothermal linear vibromotor.

Figure 2:
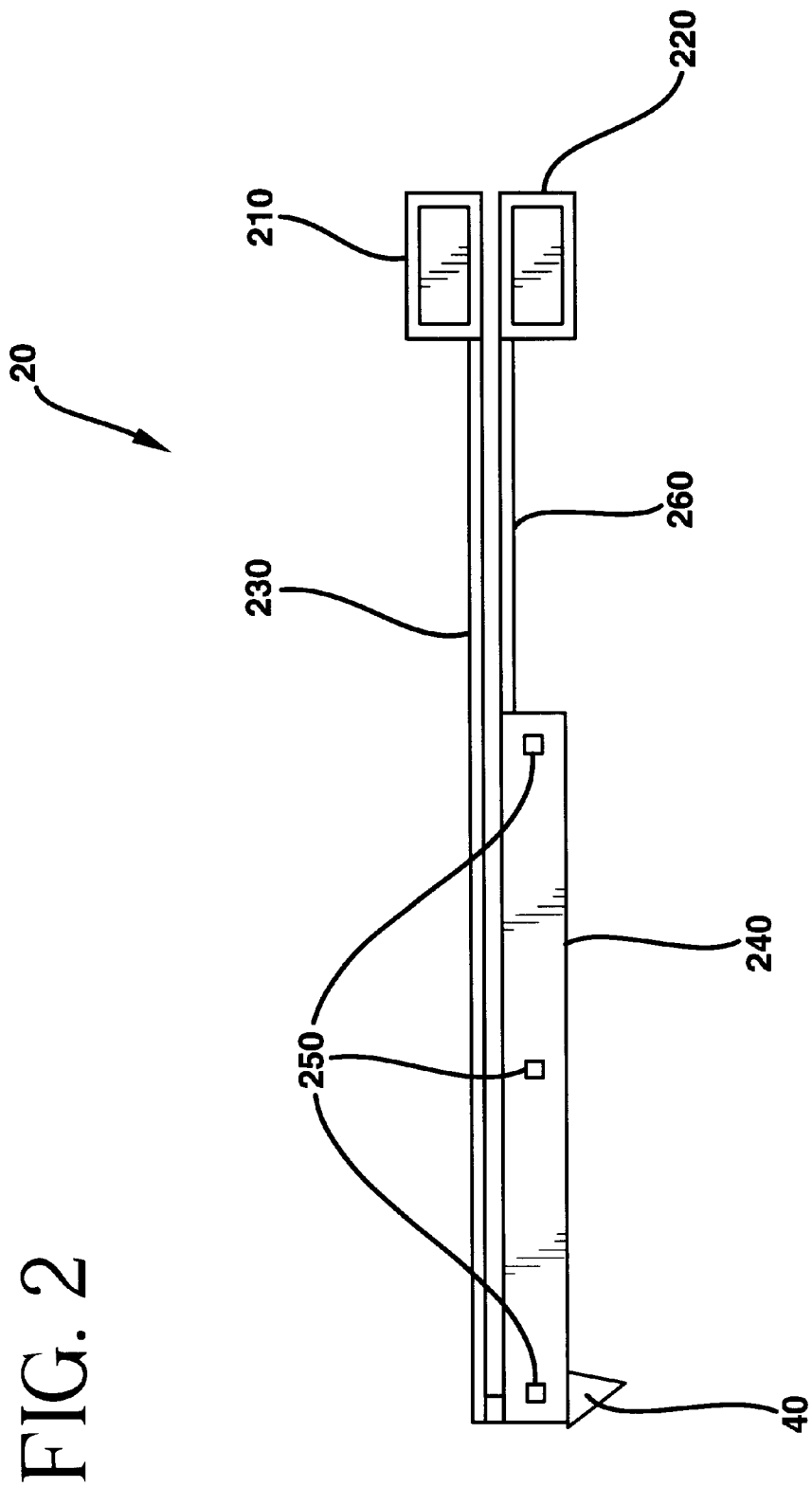
FIG. 2 is a top view representation of the thermal actuator 20 of FIG. 1, in accordance with the present invention.
Figure 7:
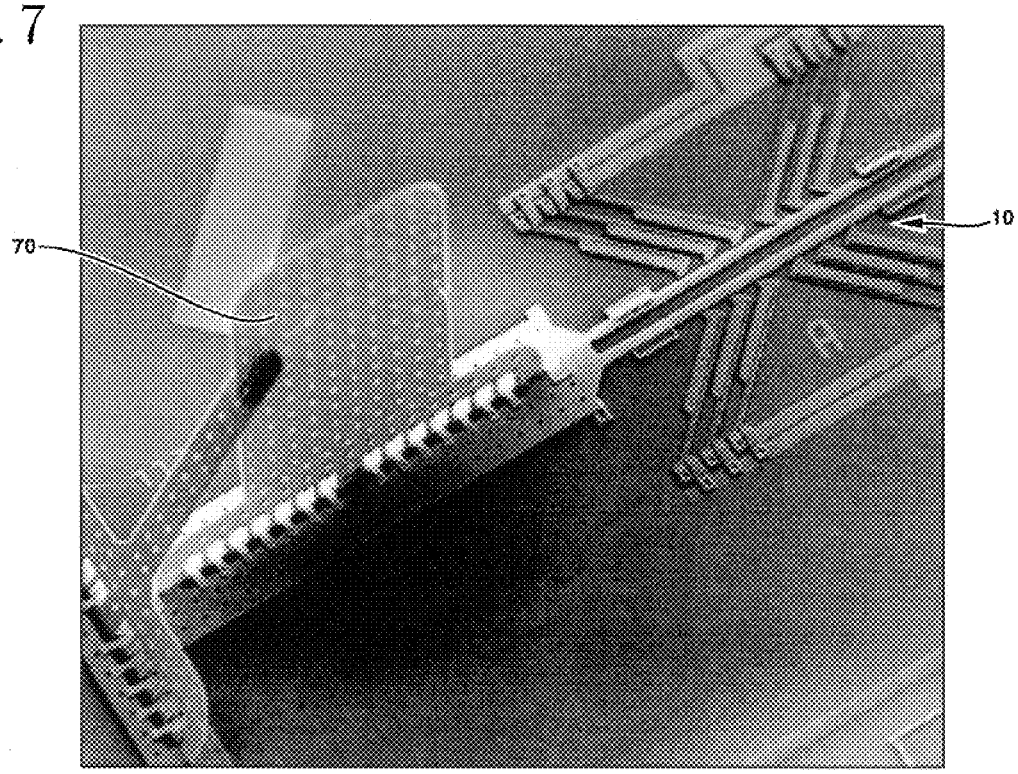
FIG. 7 is a scanning electron microscope (SEM) photograph of a fiber optic switch with an integrated electrothermal vibromotor, in accordance with the present invention.

The vibrating elements are thermal actuators 20 of FIG. 2 that are positioned at 45 degrees on both sides of a slider 110 of FIG. 1. The slider 110 could hold a mirror 70 of FIG. 7 for reflecting optical waves in switching applications, for example. Each set of vibromotor 10 contains three independent thermal actuators 20 electrically wired in parallel. The number of the thermal actuators in a set could be adjusted depending on the load of the application. Wiring in parallel ensures a lower operating voltage for the system. Optionally, as seen in FIG. 7, a second set of actuators at −45 degrees would be used to give the motor bi-directional capability. However, the ability to use one set of actuators to drive the motor in both directions would reduce its size, a critical constraint in some applications.

As a basic actuation element in this vibromotor, the thermal actuator 20 is utilized for its inherent low power level, fairly large force, and long-term reliability features. As a force generator, the thermal actuator 20 serves as an important energy converter, converting applied electrical energy to thermal energy and then to mechanical energy. The basic framework or body of the thermal actuator 20, absent the impact head 40, is a typical U-shaped, single-material, asymmetrical microstructure thermal actuator, as shown in FIG. 2 and known in the art. The temperature of the actuator body structure is raised due to the joule heating effect when applying an electrical current across the two anchors 210 and 220 at the ends of the structure. Because the cross-sectional areas of the thick arm 240 and thin arm 230 or beams are different, the higher electrical resistance in the thin arm 230 results in a higher temperature compared to that of the thick arm 240. The effect of unequal thermal expansion of the structure is amplified by a joint between the thick arm 240 and the thin arm 230 at the tip, resulting in a lateral movement of the actuator tip towards the thick arm 240 side. A deflection as large as 15 $\mu$m can be achieved in the actuator 20. The dimensions of the actuator 20 are optimized to deliver the highest force at any power.

Mechanical power transmission occurs during the impact of the thermal actuators 20 on both sides of a slider 110. The slider 110, used as a mechanical linkage, is composed of two parallel beams (15 $\mu$m wide each) connected at both ends. The intention behind narrow beams is to make the sides of the slider slightly more compliant when pushed on. This y-direction compliance assures that more friction is generated when the head 40 of the thermal actuator 20 is in contact with the slider 110. In order to lessen the friction due to the surface-to-surface contact between the moving slider 110 structure and a substrate 111 underneath, dimples 250 are added under the slider 110 and the structures that are attached to it. To achieve higher forces, the initial gap (2 $\mu$m) between the slider 10 and the head 40 of the thermal actuator 20 are made as small as possible (limited by the resolution of the process). Small deflections will also greatly lower the power consumption of this vibromotor. Guide flanges 120 are used to constrain the slider 110 on the substrate 111 and to guide the slider 110 in a desired direction with minimum wobbling. The guide flanges 120 sit on the outside of the slider 10 to reduce the friction with the slider 110 during impact actuation of the head 40.

Figure 4:
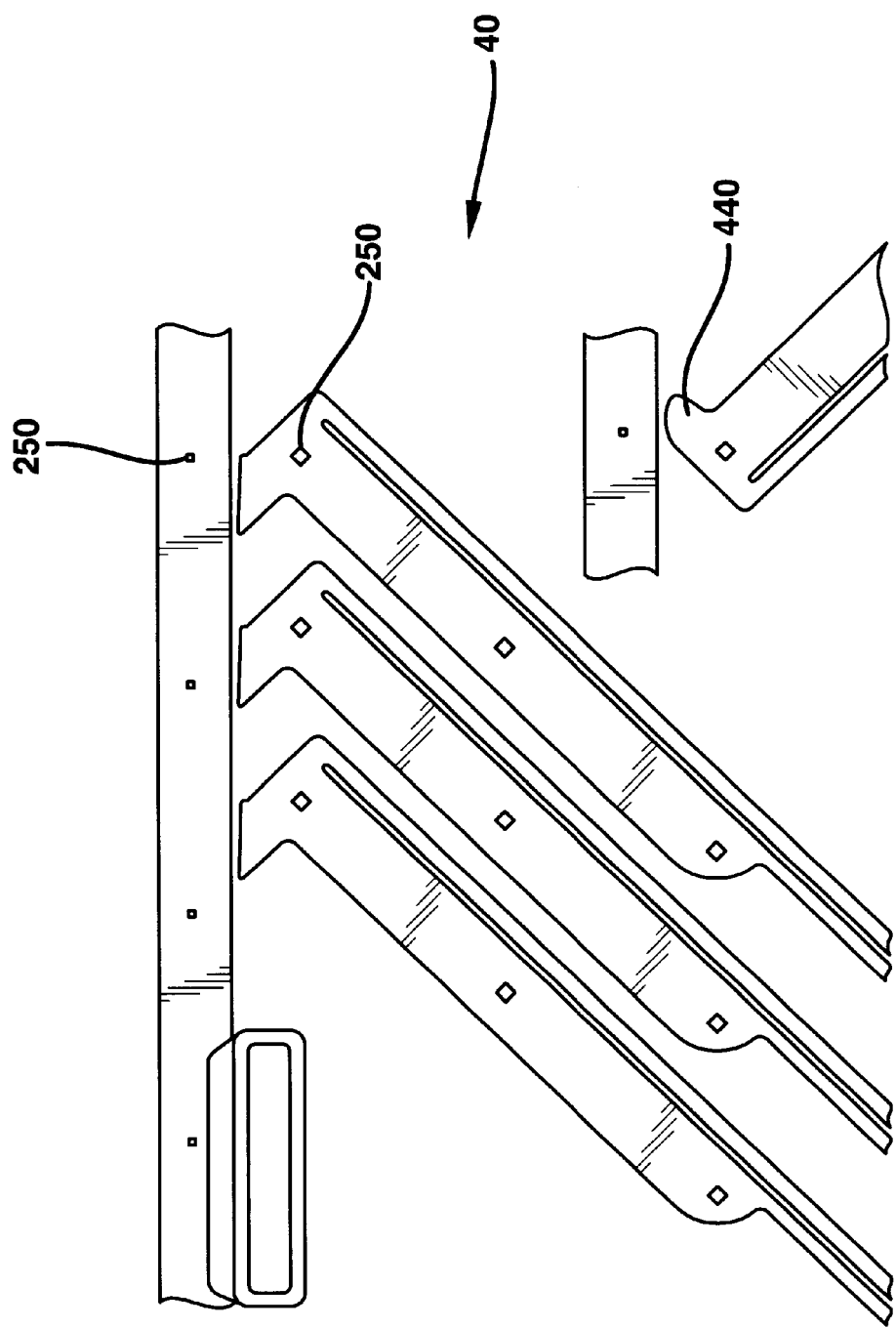
FIG. 4 is a microscopic photograph of the slope-shaped impact head 40 of the thermal actuator 20 of FIG. 2, in accordance with the present invention. The inserted picture shows the rounded head design separated from the thick arm of the actuator to show the driving mechanism more clearly.

Referring to FIG. 2, a top view representation of the thermal actuator 20 of FIG. 1 is shown. The following are examplary dimensions of the actuator 20. The thin arm 230 is 200×2.5 $\mu$m while the thick arm 240 is 135×15 $\mu$m. The flexure 260 is 65×2 $\mu$m, and the gap between the thin and thick arms is 2 $\mu$m. The head 40 of the thermal actuator 20 includes a tip that is 2 $\mu$m in length and having a 20 $\mu$m-long 28 degree slightly curved slope of the triangular tip, as shown in FIG. 4. The head 40 is designed in a suitable shape such that it has two modes of operation, which enables it to have bi-directional travel, depending on the level of current applied.

In contrast with prior-art micromotors, a typical energy-coupling element, such as the tooth-shaped drive yoke used in some stepper motors or a coupling gear in a microengine, is not needed in the driving mechanism design of the present invention. As a result, problems like gear backlash and improper impact contact that are often encountered due to the bearing clearances and improper tooth profile design can be minimized.

Hence, the ETV motor as taught by the present invention has minimum structural complexity, which increases its reliability and also has some other advantages. Since there is no additional coupling element needed between the slider 110 and a force generator (the thermal actuator 20, in this case.) direct coupling is possible. This direct coupling is much more efficient since no energy is lost in those extra components. No complicated sequence signal is required to drive different components in the device. In the present invention, each thermal actuator 20 in an array works independently without any linkage in between. In some prior-art devices, a mechanical linkage has to be used between the thermal actuators to increase the output force. However, additional energy is lost in the bending of these linkages.

The electrothermal vibromotor (ETV motor) is fabricated using the Multi-User MEMS Process (MUMPS) available at the Microelectronics Center of North Carolina (MCNC). In this surface micromachining process, low-pressure chemical vapor deposition (LPCVD) polysilicon is used as the structural layers and LPCVD phosphosilicate glass (PSG) is used for the sacrificial layers. A blanket 0.6 $\mu$m low-stress LPCVD silicon nitride layer is first deposited on the silicon wafers for electrical isolation. The first 0.5 $\mu$m-thick polysilicon layer is used to define the electrical interconnections and the electrical ground planes for the device. All the sliders 10 and the thermal actuators 40 are defined in the second 2 $\mu$m-thick polysilicon layer. The third 1.5 $\mu$m-thick polysilicon is used to define the guide flanges 120 only. Two PSG layers with thickness' of 2 $\mu$m and 0.75 $\mu$m, respectively, are deposited between the structural polysilicon layers. A final 0.5 $\mu$m-thick gold layer is deposited on the electrical probing pads. To release the structure from the oxide the sample is immersed in a bath of concentrated hydrofluoric acid (HF) at room temperature for 8 minutes. This is followed by several minutes of rinse in deionized water and then in isopropanol alcohol (IPA) bath for 15 minutes. Finally, the chip is dried in an oven at 110° C. for 15 minutes. No significant stiction was observed after release. Because of its structural simplicity the vibromotor 10, as taught by the present invention, has high yields.

In accordance with the teachings of the present invention, the motion of the slider 110 depends on the impact between the thermal actuator head 40 and the slider wall. Using the sloped flat head as one embodiment of the present invention of the impact head 40, the direction of travel for the slider 110 can be controlled by the amount of current, high or low level, through the thermal actuator 20.

Figure 3:
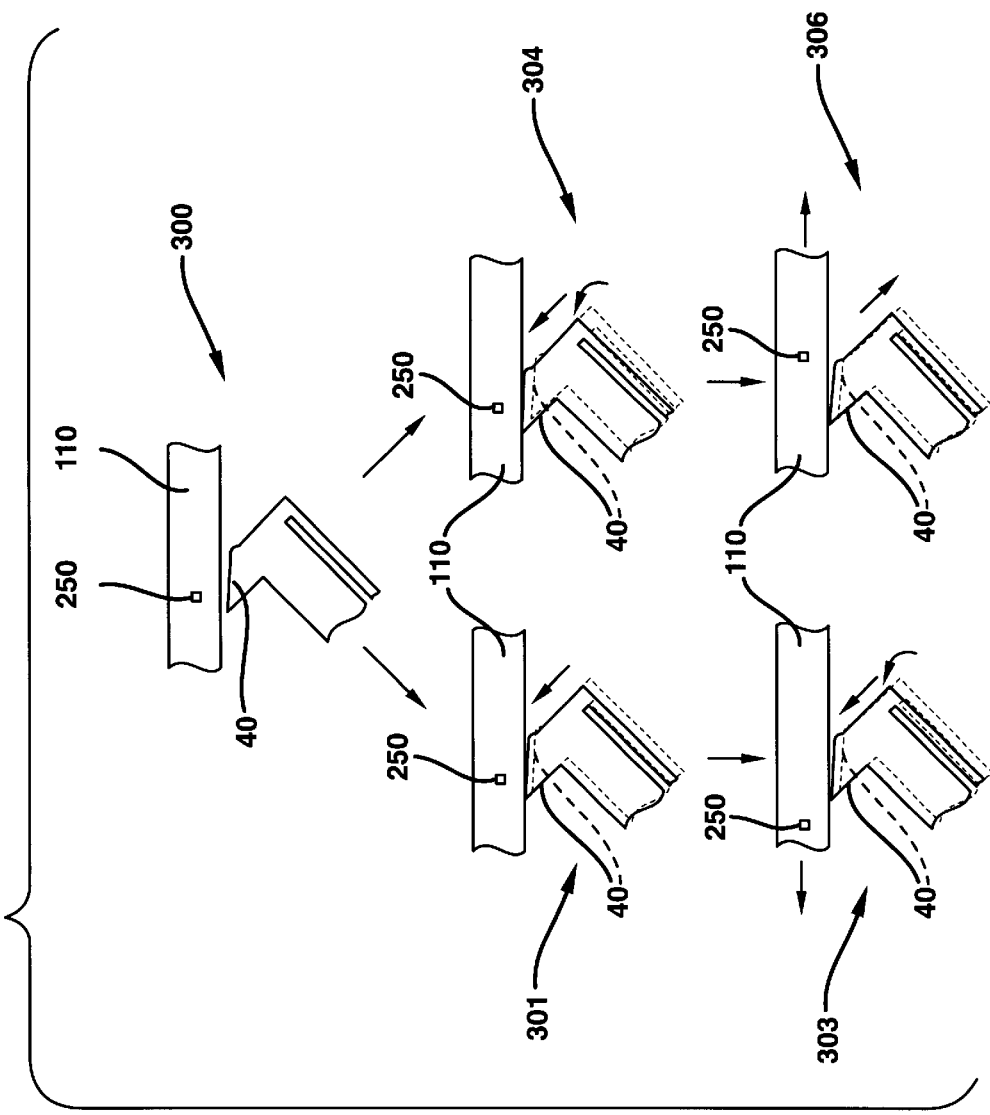
FIG. 3 is a top view depiction of the motion sequence of the thermal actuator 20 of FIG. 1, in accordance with the present invention.

Referring to FIG. 3, the basic driving mechanism of the current-controlled bi-directional electrothermal vibromotor 10 of FIG. 1 is shown. In the initial rest position 300 of the head 40 of the thermal actuator 20, there is some space or gap between the wall of the slider 10 and the head 40, before impact. When driven with lower currents (Push Mode), the slider 110 moves forward (the direction to which the thermal actuator 20 swings or taps much like the motion of a chicken pecking). This forward motion can been visualized looking at how the dimple 250 moves ahead of the actuator head 40, from representations 301 to 303, after each impact when the space between the head 40 and the slider 110 is closed or otherwise removed. Such actuator impact motion, swing, or pivoting contact is much like the tapping of a woodpecker's bill on a stationary tree or a sliding woodpecker on a stationary pole toy.

In the Push Modes of 301 and 303, the tip of the thermal actuator's head 40 makes contact with the slider 110 and keeps pushing. The preferably slope-shaped design of the head 40 causes the friction between the head 40 and the slider 10 to increase as the actuator 20 continues to deflect causing more contact and greater normal force exerted on the slider 110. At some point 303, the friction becomes large enough so that the head 40 grips the slider 110 and the slider 110 is pushed forward during the rest of the thermal actuator's forward swing. As the head 40 swings back it releases itself from the slider 110.

At higher currents (Pull Modes 304 and 306), a larger deflection of the thermal actuator 20 pushes the head 40 harder into the slider 110. Because the body of the thermal actuator 20 is framed by the two beams 230 and 240 of FIG. 2, the actuator 20 also acts as a spring pushing against the slider 110, making sure the head 40 is in full contact with the slider 110, as can be seen by representation 304. When the head 40 of the thermal actuator 20 starts to swing back, there is still friction between the head 40 and the slider 110, which pulls the slider in the backward direction as seen in representation 306, again referencing the dimple 250 movement from representations 304 to 306. Even though the speed is extremely high, the slider speed in the two directions are not equal because of the different impact conditions.

Figure 8:
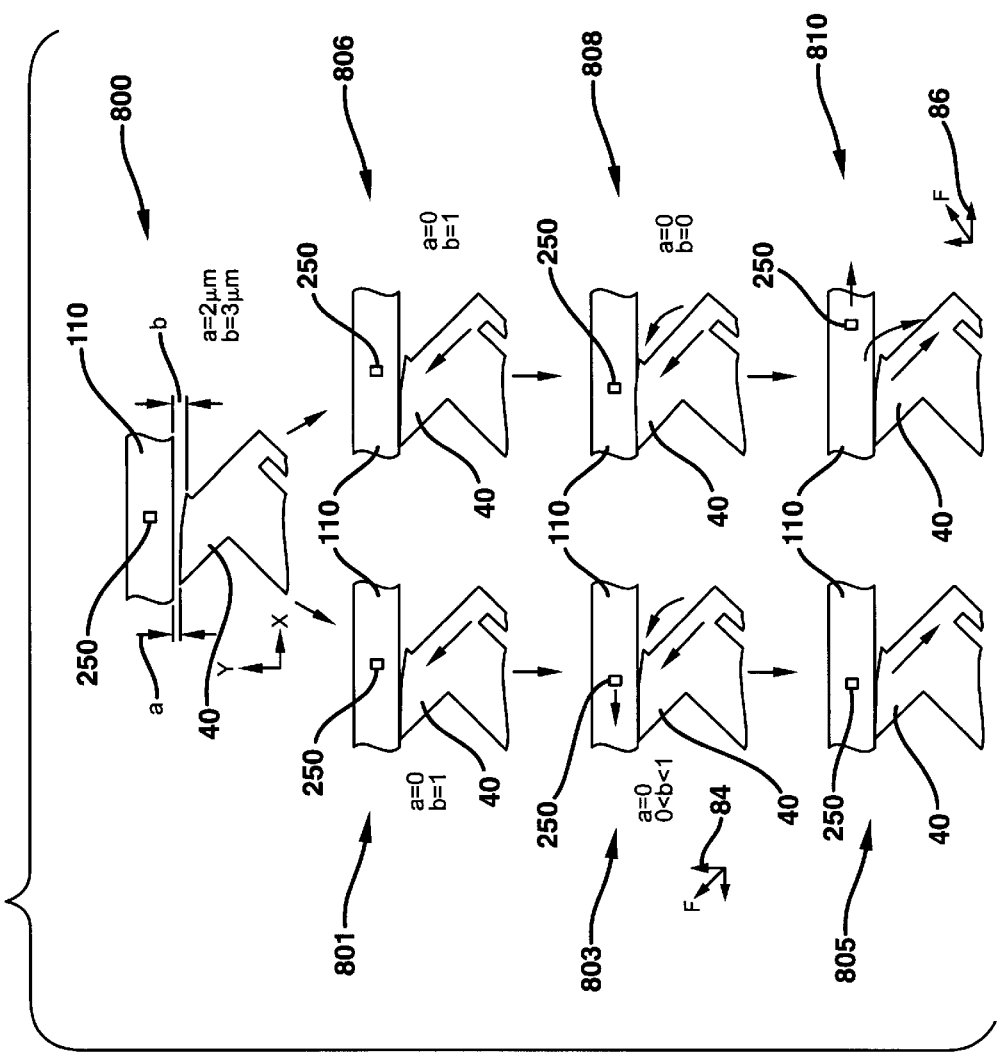
FIG. 8 is a top view depiction of the motion sequence of the thermal actuator 20 of FIG. 1, showing more detail of the two operation modes in the same swing cycle, in accordance with the present invention.

Referring to FIG. 8 for a more detailed explanation, there are two modes of operation for the actuator 20 of FIG. 1, as previously discussed. One is the lower current Push Mode, where the slider 110 can be pushed forward (the direction to which the thermal actuator 20 including its head 40 swings). The other is the higher current Pull Mode, where the slider 110 can be pulled backwards. The first representation 800 shows the initial rest position of the impact head 40 with respect to the wall of the slider 110. The distance between a tip section of the impact head 40 and the wall of the slider 110 is denoted as a, while b is the distance between a tail section of the impact head and the wall of the slider 110. Because the slope of the tail section is steeper, more inclined, or otherwise corresponding less to the shape of the slider 110, distance b is also greater than distance a. The thermal actuator 20 of FIG. 2 will start to swing back and forth when supplied with an AC signal. During the thermal actuator's forward swing 801 to 803, the impact head 40 moves inward to the slider 10 and closes the gap before the tip of the head 40 touches the wall. Because the thermal actuator 20 is somewhat compliant in the y-direction due to its two-beam structure, the tip of the impact head 40 will act as a pivot point and the head 40 rotates as the thermal actuator 20 continues pushing into the slider 110, making b<1 μm in 803. The friction between the impact head 40 and the wall of the slider 110 will increase, proportionally to the normal force 84 exerted on the slider 110, and at some point, grasps the slider 110 and push it forward as denoted in 803. Before the whole impact head 40 makes full contact with the slider (b=0), the head 40 of the thermal actuator starts to swing back, releasing itself from the slider 110 in 805. The impact head 40 will then go back to its initial position, preparing for the next swing in the Push Mode situation.

However, in the Pull Mode 806, 808, and 810, due to the higher current applied, the impact head 40 will rotate further and makes full contact (b=0) while the head 40 of the thermal actuator keeps pushing inward to the slider in 808. Now the head 40 of the thermal actuator acts like a gripper that clamps the slider 110 in position, and the energy is stored in the bending of the thermal actuator 20 of FIG. 2. When the head 40 of the thermal actuator starts to swing back, a partial force in the x-direction 86 is exerted on to the slider 110 while the impact head 40 rotates back, which pulls the slider 110 to move backwards in 810. Then the head 40 releases from the slider 110 and back to its initial position, waiting for another cycle. As noted before, because of different impact conditions in these two modes, the speed of the slider 110 will not be the same as it moves in the two directions.

Conventional thermal actuators reported to date have used a driving signal of either a DC voltage or a voltage square wave with a 50% duty cycle. Usually a strong decrease in the deflection of beams that are 200 μm in length is observed when driven by signal frequencies up to 1.5 kHz. Although a higher deflection can be achieved at this frequency by increasing applied current, it often leads to permanent plastic deformation of the thin arm. This occurs when the brittle-to-ductile transition temperature is reached in the thin arm which cannot dissipate the excess heat fast enough. The stress on the two ends of the arm leads to buckling, causing the actuator to bend back and change its rest position from that of the initial state. This not only limits the driving frequency and speed of the electrothermal vibromotor, but also is a detriment to its lifetime. To improve its frequency performance, the effect of the driving signal has been explored.

When driven at frequencies above 4.5 kHz with a sinusoidal AC signal, a conventional thermal actuator responds with a fixed deflection rather than oscillation. This is because the cooling of the conventional thin arm can no longer keep up with the driving frequency. Although oscillation on top of this offset deflection can be seen by increasing the applied current, the swing amplitude is so small (<1 μm) that it is generally not useful. Furthermore, it would often quickly lead to permanent plastic deformation of the thin arm, or even fuse the device. This not only limits the maximum possible driving frequency, and thus the speed of the ETV motor, but also is a detriment to its lifetime, as previously mentioned.

Theoretically, reducing the thermal time constant through optimized thermomechanical design can increase the frequency performance of the actuator, however, the use of an AC+DC driving signal has been found to improve the performance of the system. The swing amplitude can be increased enormously at high frequencies by adding a DC bias on top of the sinusoidal AC signal. Under this driving condition, the thermal actuator oscillates from a point that is different from the initial rest position. This new starting point is the offset deflection caused by the high frequency AC, as described earlier. This method opens up a possibility for thermal actuators to be safely tuned to a much higher frequency while still having useful swing amplitudes. The highest frequency observed in the actuator 20 is above 70 kHz.

The power dissipated in the thermal actuator is equal to $I^2R$, where I is the amount of current applied and R is the resistance of the beams. This energy raises the temperature of the actuator, while the heat is dissipated mainly through conduction via the anchor to the substrate, and convection and radiation to the ambient air. If the square of the input current ($I^2$) versus time (t) is plotted, the area under the curve is proportional to the energy input to the system over a period of time. There exists a "threshold" area under the curve for a specific period of time, above which plastic deformation will occur. This threshold will depend on the heat dissipation rate under the applied current condition during that period of time.

Figure 5A:
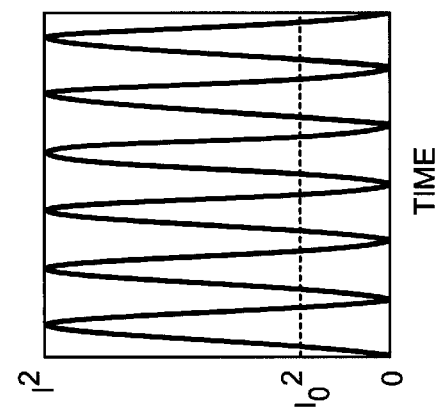
FIG. 5a is a chart showing the current square ($I_2$) vs. time (t) plot of the sinusoidal AC voltage input at low frequency.
Figure 5B:
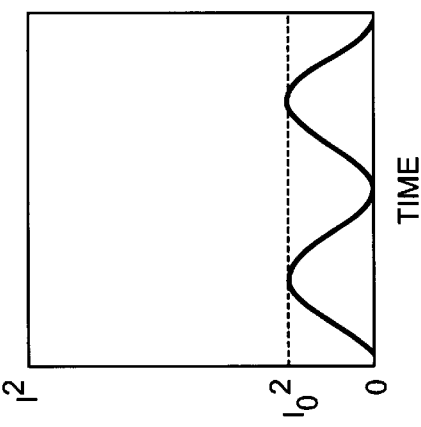
FIG. 5b is a chart showing the current square ($I_2$) vs. time (t) plot of the sinusoidal AC input at high frequency

For a sinusoidal AC voltage input, the $I^2$-t plot will look like the one shown in FIG. 5a, assuming that the resistance of the thermal actuator does not change with time. As the actuator is driven to higher frequencies, the amplitude of the deflection decreases. Increasing the current driving the actuator as is shown in FIG. 5b can compensate for the decrease in deflection. However, at a certain frequency, governed by the thermal time constant of the element, the actuator will no longer work. A reduction of the thermal time constant through optimized thermomechanical design can increase the frequency performance of the actuator and increase the speed of the vibromotor. However, because of the magnitude of the input current, the temperature of the element could easily pass the threshold for plastic deformation.

Figure 5C:
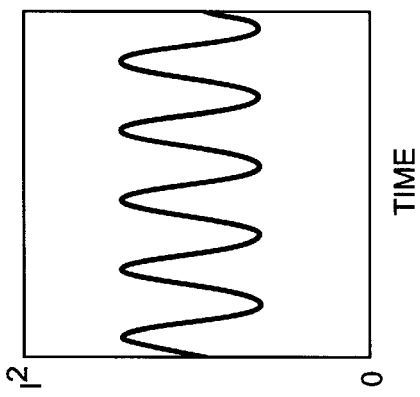
FIG. 5c is a chart showing the current vs. time plot of the AC+DC input, in accordance with the present invention.
Figure 5D:
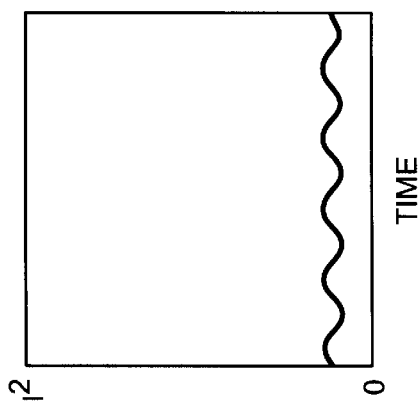
FIG. 5d is a chart showing the current square ($I_2$) vs. time (t) plot of the AC+DC input, in accordance with the present invention.

In accordance with the teachings of the present invention, a waveform consisting of a sinusoidal AC voltage offset by a DC bias as shown in FIG. 5c is applied. The DC bias will cause a deflection of the actuator 20 reducing the gap between the head 40 and the slider 110. The time of impact occurs sooner due to the ac voltage improving the motor performance. This $I^2$-t plot of the faster impact is shown in FIG. 5d. Because current never reaches zero due to the DC offset, the total energy fed into the system is greatly increase. Hence, the peak voltage level needed to reach the desired deflection is reduced. The frequency of impacts is reduced by a factor of two compared to that of a pure ac signal where impact occurs at both the positive and negative peak. This operation method allows the thermal actuator 20 to be safely tuned to a much higher frequency.

The testing of the electrothermal vibromotor, in accordance with the present invention, was conducted in an open bay lab. The test setup consisted of a probe station, a function generator, a DC power supply, two multimeters and a CCD camera attached to the microscope. Video was recorded on a computer for analysis.

First, a 200 Hz sinusoidal AC voltage input (no DC bias) was used to drive the electrothermal vibromotor 10 of FIG. 1. The amplitude of the voltage was increased from 0 V to a level where the head 40 of the thermal actuator 20 starts to tap or otherwise provide impact to the slider 110 but not enough to make full area contact with the slider 110. At this point the slider will start to move forward, as in FIG. 8.1B. Observation of how the head 40 of the thermal actuator 20 contacts the slider 110 is straightforward because the image is a superposition of the vibrating element. When the applied voltage is further increased, the slider 110 will suddenly change its direction and starts to move backward, as in FIG. 8.2C. Travel across the full range (390 µm) of the actuator 20 of FIG. 2, in both directions was observed even though the speed was inconsistent. This inconsistency was due to variation in the step sizes from factors such as the friction with the substrate 111 and the guide flanges 120 of FIG. 1. The ability to drive the electrothermal vibromotor with AC signal frequencies above 2 kHz was achieved. Applied AC voltages to the system range from 5.4 V to 6.6 V, and the total current (for six thermal actuators 20) were measured from 18.3 mA to 23.0 mA. The change from forward actuation to backward actuation can be controlled by increasing the AC voltage by about 1 volt. Typically, prior-art thermal actuators are not expected to move at such high frequencies, however, in this case the structures and the deflections are small (microns) for the actuators 20 as taught by the present invention.

Figure 6:
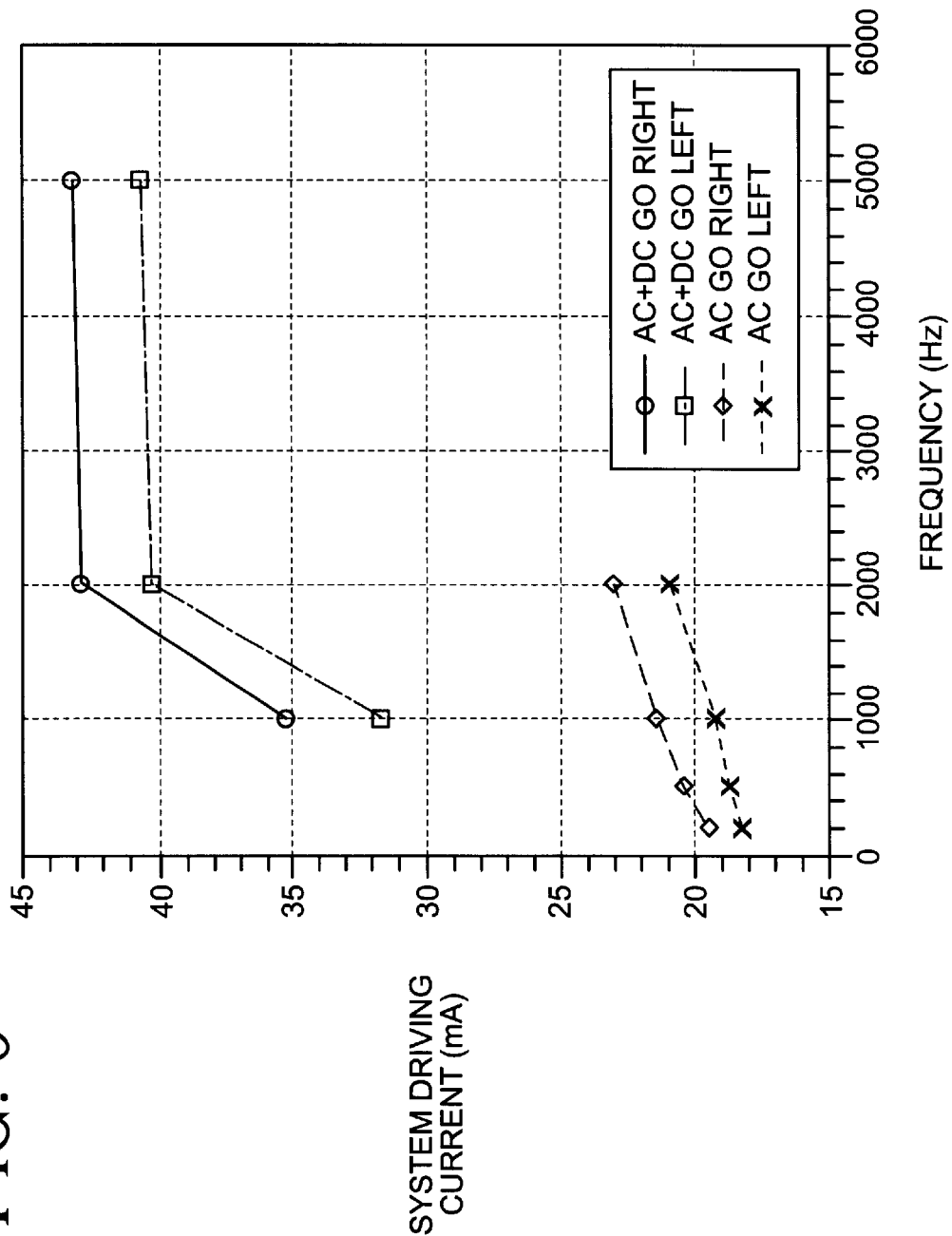
FIG. 6 is a chart showing the measured system driving current vs. frequency based on a sample of six thermal actuators in two operational modes.

A 2 V sinusoidal AC signal at 5 kHz plus a 10 V DC bias, which corresponds to a total current of 49.6 mA can be used, as an example, to drive the thermal elements or actuators 20. The measured total current for both operation modes is plotted in FIG. 6. Under this driving signal, travel in both directions was very smooth. It was also very easy to change the direction of motion by simply adjusting the DC bias level (plus or minus 1 volt). The traveling speed observed is proportional to the driving frequency. From the recorded video, a speed above 3 mm/set was measured for the slider 110. Backward motion of the slider was faster than the forward motion. This is expected because the head 40 is in full contact longer during the Pull Mode, as depicted in FIG. 8.2B. Driving the thermal elements or actuators 20 at 10 kHz has been done by tuning the AC signal to 4 volts. The force generated by this AC+DC operation appears much larger than when driving with pure AC. Furthermore, the ability to drive the slider 110 with only one set of thermal actuators 20 on only one side of the slider 110 was achieved. In some situations, even one thermal actuator 20 alone is enough to move the slider 110.

A round-headed thermal actuator 440, as shown in the picture insert in FIG. 4, has been included as a test structure and shows only the Pull Mode operation or backward travel motion. This alternate design could be used in applications where only one traveling direction is needed or similar traveling speed in two directions is preferred.

Referring to FIG. 7, a scanning electron microscope (SEM) photograph of a fiber optic switch with an integrated electrothermal vibromotor 10 of FIG. 1, in accordance with the present invention is shown. As a demonstration of this electrothermal vibromotor 10 of the present invention, it was coupled with a gear 300 µm in diameter, making a rotation stage for optical applications a possibility. In addition, the motor was used to drive a vertical micromirror 70 that was designed for a free space optical fiber switch. The micromirror has a dimension of 300×400 µm and could be move back and forth over the full travel range of 350 µm.

Hence, a compact polysilicon surface-micromachined electrothermally actuated vibromotor 10 of FIG. 1 is taught by the teachings of the present invention. Mechanical power transmission occurs during the impact of the thermal actuators 20 on the sides of a movable guided slider 10. Current-controlled bi-directional operation is made possible through the impact head design 40 having at least two different edges. A traveling speed of at least 3 mm/sec was measured when driven with a 2.0 V AC input signal at 5 kHz plus a 10.0 V DC bias offset. The electrothermal vibromotor 10 has been actuated with thermal elements or actuators 20 driven at frequencies above 19 kHz. As a demonstration, a hinged vertical micromirror 70 designed for free-space fiber-optic switch systems has been moved back and forth over a full range of 350 µm.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An apparatus to provide impact actuation in a microelectromechanical system (MEMS), the apparatus comprising:

an electrothermal linear vibromotor having at least one vibrating thermal element pivotally attached for providing oblique impact actuation between a space opening position and a space closing position; and a movable guided element slidable in response to the oblique impact actuation of the electrothermal linear vibromotor wherein the movable guided element is directly coupled to the electrothermal linear vibromotor when the vibromotor is in the space closing position.

2. The apparatus of claim 1, wherein the movable guided element comprises a slider.

3. The apparatus of claim 1, wherein the vibromotor comprises a polysilicon surface-micromachined electrothermal vibromotor (ETV motor).

4. The apparatus of claim 1, wherein the vibromotor is driven by CMOS integrated circuit compatible voltages.

5. The apparatus of claim 1, wherein the movable guided element changes a linear direction in response to an applied electrical current controlled by the vibromotor.

6. The apparatus of claim 1, wherein the vibromotor is driven by CMOS integrated circuit compatible voltages having at least an AC component.

7. A vibromotor for a microelectromechanical system (MEMS) sized in the $\mu m_2$ range, the vibromotor comprising:

a substrate;

a movable guided element slidably mounted on the substrate; and at least one thermal micro-actuator having an impact head and an anchoring end for the impact head to tap between a space opening position and a space closing position, the anchoring end pivotally disposed on the substrate external to a side of the movable guided element for controlling the movement of the movable guided element by electrothermally biasing the impact head for oblique impact actuation to directly tap against the movable guided element when the impact head is in the space closing position.

8. The vibromotor of claim 6, wherein the at least one thermal micro-actuator is positioned at an impact angle from the movable guided element.

9. The vibromotor of claim 6, wherein the at least one thermal micro-actuator comprises a first opposed pair having at least two micro-actuators positioned about negative forty-five degrees from the movable guided element electrically wired in parallel on both sides of the movable guided element.

10. The vibromotor of claim 9, wherein the at least one thermal micro-actuator comprises a second opposed pair having at least two micro-actuators positioned about forty-five degrees from the movable guided element electrically wired in parallel on both sides of the movable guided element for providing bi-directional movement.

11. The vibromotor of claim 7, wherein the impact head comprises a protrusion having a tip section having a first slope and a tail section having a second slope steeper than the first slope, wherein the first slope of the tip section makes pivotal contact with the movable guided element before the second slope of the tail section.

12. The vibromotor of claim 11, wherein the movable guided element moves in a first direction when the tip section makes contact with the movable guided element, at a first voltage level.

13. The vibromotor of claim 12, wherein the movable guided element moves in a second direction opposite to the first direction when both the tip section and the tail section make contact with the movable guided element, at a second voltage level higher than the first voltage level.

14. The vibromotor of claim 12, wherein the second voltage has an AC component and a DC component.

15. A vibromotor comprising:

a silicon substrate sized suitably small for use in a microelectromechanical system (MEMS);

a movable guided element slidably mounted on the silicon substrate; and at least one thermal actuator having an impact protrusion and an anchoring end, the anchoring end pivotally disposed on the silicon substrate external to a side of the movable guided element for controlling the movement of the movable guided element by electrothermally biasing the impact protrusion between a space opening position and a space closing position for oblique impact actuation to repeatedly tap against the movable guided element when the impact head is in the space closing for providing a frictional interaction between the impact protrusion and the movable guided element to cause the movable guided element to slide along the silicon substrate.

16. The vibromotor of claim 15, wherein the impact protrusion has a tip section having a first slope and a tail section having a second slope steeper than the first slope, wherein the first slope of the tip section makes pivotal contact with the movable guided element before the second slope of the tail section.

17. The vibromotor of claim 16, wherein the movable guided element moves in a first direction when the tip section makes contact with the movable guided element, at a first voltage level.

18. The vibromotor of claim 17, wherein the movable guided element moves in a second direction opposite to the first direction when both the tip section and the tail section make contact with the movable guided element, at a second voltage level higher than the first voltage level.

19. The vibromotor of claim 17, wherein the first voltage has at least an AC component.

20. The vibromotor of claim 18, wherein the second voltage has at least an AC component component.

* * * * *